US012641848B2

(12) United States Patent
Ohse

(10) Patent No.: US 12,641,848 B2
(45) Date of Patent: May 26, 2026

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Naoyuki Ohse, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 409 days.

(21) Appl. No.: 18/497,427

(22) Filed: Oct. 30, 2023

(65) Prior Publication Data

US 2024/0290842 A1    Aug. 29, 2024

(30) Foreign Application Priority Data

Dec. 1, 2022    (JP) ................................ 2022-193062

(51) Int. Cl.
| | |
|---|---|
| *H10D 30/66* | (2025.01) |
| *H10D 12/01* | (2025.01) |
| *H10D 30/01* | (2025.01) |
| *H10D 62/832* | (2025.01) |
| *H10D 64/01* | (2025.01) |
| *H10P 95/90* | (2026.01) |

(52) U.S. Cl.
CPC ....... *H10D 62/8325* (2025.01); *H10D 12/031* (2025.01); *H10D 30/0297* (2025.01); *H10D 30/668* (2025.01); *H10D 64/0115* (2026.01); *H10P 95/90* (2026.01)

(58) Field of Classification Search
CPC ............. H10D 12/031; H10D 30/0297; H10D 30/668; H10D 62/393; H10D 62/81; H10D 62/8325; H10D 64/60; H10D 64/62
See application file for complete search history.

(56) References Cited

U.S. PATENT DOCUMENTS 4,990,997 A  *   2/1991  Nishida ............. H01L 21/76859
                                             257/E21.584
6,156,647 A  *  12/2000  Hogan ............. H01L 21/76846
                                             438/653

(Continued)

FOREIGN PATENT DOCUMENTS

JP          4765001 B2     9/2011
JP       2016-111135 A     6/2016
(Continued)

*Primary Examiner* — Eric A. Ward
(74) *Attorney, Agent, or Firm* — Rabin & Berdo, P.C.

(57) ABSTRACT

A silicon carbide semiconductor device includes a starting substrate of a first conductivity type, a first semiconductor layer of the first conductivity type, a second semiconductor layer of a second conductivity type, a first semiconductor region of the first conductivity type, a gate insulating film, a gate electrode, an interlayer insulating film, an ohmic electrode, a barrier metal provided at the surface of the ohmic electrode and the surface of the interlayer insulating film, a surface electrode provided at the surface of the barrier metal, and a back electrode. The barrier metal has a three-layered structure including a first TiN film, a Ti film, and a second TiN film; the first TiN film contains TiN having a crystal grain size that is larger than a crystal grain size of TiN of the second TiN film.

12 Claims, 8 Drawing Sheets

(56)           References Cited

U.S. PATENT DOCUMENTS

| | | |
|---|---|---|
| 2016/0163806 A1 | 6/2016 | Nishimura |
| 2017/0170126 A1 * | 6/2017 | Kuribayashi |
| 2017/0271486 A1 * | 9/2017 | Komatsu ............... H10D 64/62 |
| 2018/0294350 A1 * | 10/2018 | Utsumi .............. H01L 21/0485 |
| 2019/0109065 A1 * | 4/2019 | Hashizume ........ H10D 62/8325 |
| 2020/0295174 A1 * | 9/2020 | Sabri ..................... H10D 30/66 |
| 2021/0074845 A1 | 3/2021 | Hoshi |
| 2021/0285917 A1 * | 9/2021 | Liu ....................... B06B 1/0292 |
| 2022/0130974 A1 * | 4/2022 | Xu ................... H01L 21/76846 |

FOREIGN PATENT DOCUMENTS

| | | |
|---|---|---|
| JP | 6617546 B2 | 12/2019 |
| JP | 2021-044274 A | 3/2021 |

* cited by examiner

- 15
- SECOND TiN FILM — 25
- Ti FILM — 24
- FIRST TiN FILM — 23
- 13

- 15
- SECOND TiN FILM — 25
- Ti FILM — 24
- FIRST TiN FILM — 23
- 11

| STACKED STRUCTURE | TiN(200) | TiN(200) GRAIN SIZE |
|---|---|---|
| Ti | NO | 0, OR EXTREMELY SMALL |
| TiN | YES | LARGE |
| TiN+HEAT TREATMENT | YES | LARGER |
| Ti/TiN | NO | 0, OR EXTREMELY SMALL |

S11
OPEN CONTACT HOLES

S12
FORM OHMIC ELECTRODES

S13
Ti SPUTTERING

S14
TiN SPUTTERING

S15
FORM SOURCE ELECTRODE
PAD

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2022-193062, filed on Dec. 1, 2022, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) is expected to replace silicon (Si) as a next-generation semiconductor material. Compared to a conventional semiconductor device element that uses silicon as a semiconductor material, a semiconductor device that uses silicon carbide as a semiconductor material (hereinafter, silicon carbide semiconductor device) has various advantages such as enabling resistance of a device in an ON state to be reduced to a few hundredths and application under higher temperature (200 degrees C. or higher) environments. These advantages are due to characteristics of the material itself in that a bandgap of silicon carbide is about 3 times larger than that of silicon and dielectric breakdown field strength thereof is nearly an order of magnitude greater than that of silicon.

Up to now, Schottky barrier diodes (SBDs) and vertical metal oxide semiconductor field effect transistors (MOSFETs) having a trench gate structure or planar gate structure have become commercialized as silicon carbide semiconductor devices.

A structure of a conventional silicon carbide semiconductor device is described taking a trench-type MOSFET as an example. In the trench-type MOSFET, an $n^+$-type buffer layer and an n-type silicon carbide epitaxial layer are deposited on a front surface of an $n^+$-type starting substrate. In the n-type silicon carbide epitaxial layer, at a first surface thereof opposite to a second surface thereof facing the $n^+$-type starting substrate, an n-type high-concentration region is provided. Further, in the n-type high-concentration region, at a first surface thereof opposite to a second surface thereof facing the $n^+$-type starting substrate, a first $p^+$-type base region is selectively provided. In the n-type high-concentration region, a second $p^+$-type base region is selectively provided so as to cover an entire area of a bottom of a trench.

Further, in the conventional trench-type MOSFET, a p-type base region, an $n^+$-type source region, a $p^{++}$-type contact region, a gate insulating film, a gate electrode, an interlayer insulating film, an ohmic electrode (source electrode), a back electrode, the trench, a source electrode pad, and a drain electrode pad are further provided. The ohmic electrode is provided on the $n^+$-type source region and the $p^{++}$-type contact region, and the source electrode pad is provided on the ohmic electrode.

Hydrogen contained in the source electrode pad (Al electrode) diffuses to the gate interface and thus, is known to cause threshold fluctuation. Therefore, between the gate interface and the Al electrode, formation of a barrier metal constituted by a metal film capable of occluding hydrogen has been proposed. For example, the problem of threshold fluctuation is solved by using a hydrogen occlusion effect of titanium (Ti). In this case, when Al and Ti are alloyed, the hydrogen occlusion effect is lost and therefore, a metal film containing titanium nitride (TiN) is provided between Ti and Al, thereby, suppressing alloying.

FIG. 12 is a flowchart showing an outline of barrier metal formation of the conventional silicon carbide semiconductor device. The ohmic electrode, the barrier metal, and the source electrode pad are formed as follows by a process of forming a front electrode of the silicon carbide semiconductor device. First, a contact hole is opened in the interlayer insulating film (step S11), thereby, exposing the $n^+$-type source region and the $p^{++}$-type contact region. Next, nickel (Ni) is deposited in the contact hole and annealed, thereby, forming the ohmic electrode of a nickel silicide (NiSi) (step S12). Next, a Ti film is deposited on the ohmic electrode by a sputtering method (step S13). Next, a TiN film is deposited on Ti film by a sputtering method (step S14), thereby forming the barrier metal constituted by the Ti film and the TiN film. Next, an aluminum (Al) film or an Al—Si film is deposited, thereby, forming the source electrode pad (step S15).

Further, in a known semiconductor device, a first source electrode is in ohmic contract with a semiconductor substrate ($n^+$-type source region) in the contact holes and electrically insulated from a first gate electrode by an interlayer insulating film, the first source electrode being constituted by a multilayer film in which an NiSi electrode, a first TiN film, a first Ti film, a second TiN film, a second Ti film, and an Al alloy film are sequentially stacked on the $n^+$-type source region (refer to Japanese Laid-Open Patent Publication No. 2021-44274).

Further, a known semiconductor device includes a hydrogen occluding layer containing a first metal capable of occluding hydrogen, a nitride layer provided on a top of the hydrogen occluding layer and containing a nitride of the first metal, an alloy layer provided on a top of the nitride layer and containing an alloy of aluminum and a second metal, and an electrode layer provided on a top of the alloy layer and containing aluminum, and between the electrode layer and the nitride layer is free of a pure metal layer of the second metal (refer to Japanese U.S. Pat. No. 6,617,546).

SUMMARY OF THE INVENTION

According to an embodiment of the present invention, a silicon carbide semiconductor device includes: a starting substrate of a first conductivity type, having a first surface and a second surface that are opposite to each other; a first semiconductor layer of the first conductivity type, provided at the first surface of the starting substrate, the first semiconductor layer having an impurity concentration that is lower than an impurity concentration of the starting substrate, the first semiconductor layer having a first surface and a second surface that are opposite to each other, the second surface of the first semiconductor layer facing the first surface of the starting substrate; a second semiconductor layer of a second conductivity type, provided at the first surface of the first semiconductor layer, the second semiconductor layer having a first surface and a second surface that are opposite to each other, the second surface of the second semiconductor layer facing the first surface of the first semiconductor layer; a first semiconductor region of the first conductivity type, selectively provided in the second semiconductor layer, at the first surface of the second semiconductor layer; a gate electrode provided at a surface of the first semiconductor region and the first surface of the second semiconductor layer via a gate insulating film; an interlayer insulating film covering the gate insulating film and the gate electrode; an ohmic electrode provided at the surface of the first semiconductor region and the first surface of the second semiconductor layer; a barrier metal provided at a surface of the ohmic electrode and a surface of the interlayer insulating film; a surface electrode provided at a surface of the barrier metal; and a back electrode provided at the second surface of the starting substrate. The barrier metal has a three-layered structure including a first TiN film, a Ti film, and a second TiN film, and the first TiN film contains TiN having a crystal grain, a size of which is larger than a size of a crystal grain contained in TiN of the second TiN film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a graph depicting a crystalline structure of Ti and TiN in an instance in which a TiN film is formed on a Ti film.

FIG. 5 is a graph depicting the crystalline structure of TiN in an instance in which the TiN film is formed directly on a $SiO_2$ film.

DETAILED DESCRIPTION OF THE INVENTION

Figure 1:
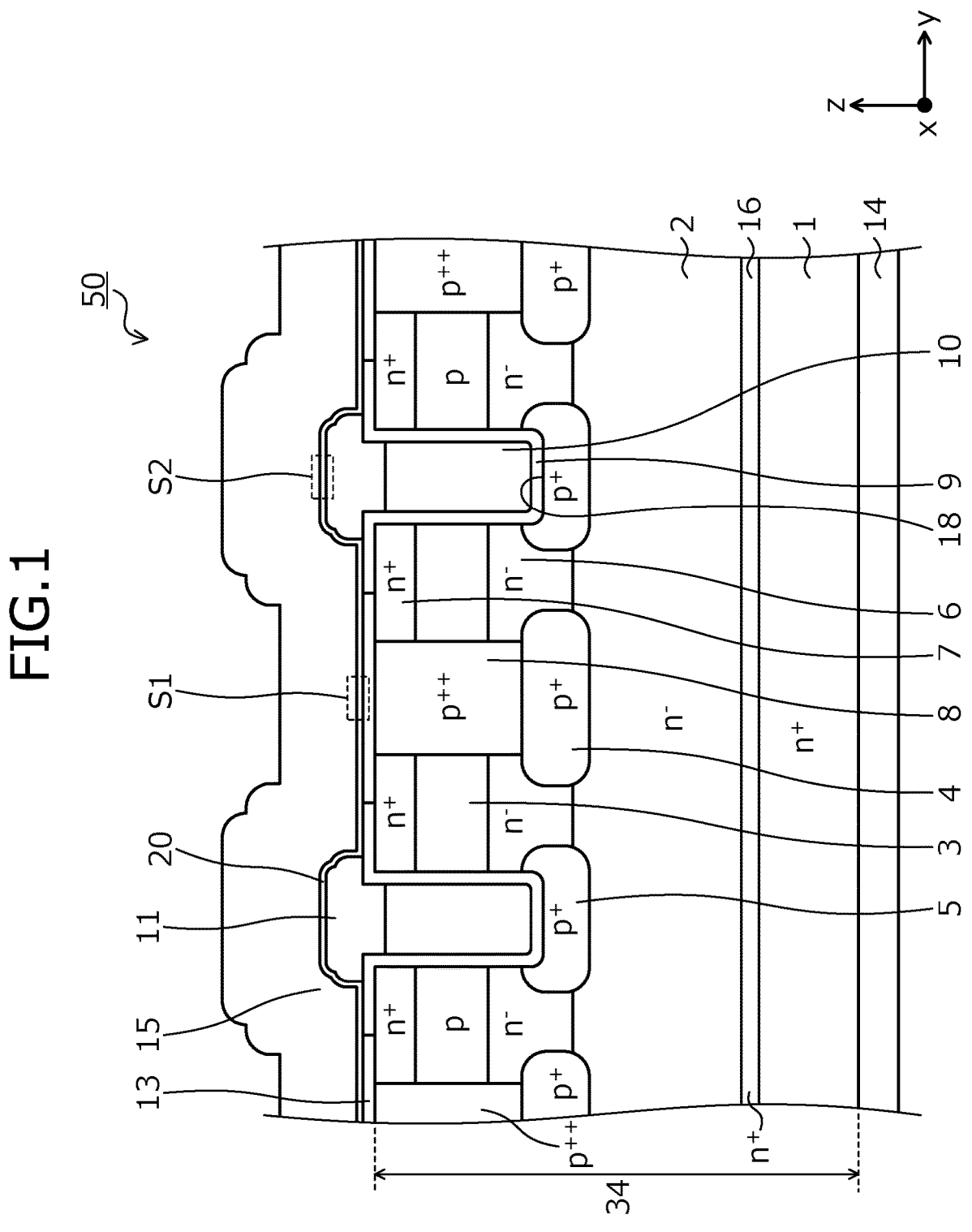
FIG. 1 is a cross-sectional view depicting a structure of a silicon carbide semiconductor device according to an embodiment.

First, problems associated with the conventional techniques are discussed. As described, conventionally, the barrier metal is formed having a two-layer structure including a Ti film and a TiN film. In this case, Ti is deposited on the NiSi ohmic electrode. Silicon carbide semiconductor devices are often used under high temperatures as compared to silicon semiconductor devices. Nonetheless, when a silicon carbide semiconductor device is used long-term under high temperatures, a problem arises in that voids occur between NiSi and Ti, and the threshold fluctuates.

Embodiments of a silicon carbide semiconductor device and a method of manufacturing a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

A semiconductor device according to the present invention contains a wide band gap semiconductor. In an embodiment, a silicon carbide semiconductor device fabricated (manufactured) using, for example, silicon carbide (SiC) as a wide band gap semiconductor is described taking a trench-type MOSFET 50 as an example. FIG. 1 is a cross-sectional view depicting a structure of a silicon carbide semiconductor device according to the embodiment. In FIG. 1, only an active region through which a main current of the trench-type MOSFET 50 flows is depicted.

As depicted in FIG. 1, in the silicon carbide semiconductor device according to the embodiment, at a first surface (front surface), for example, (0001) plane (Si-face) of an $n^+$-type starting substrate (starting substrate of a first conductivity type) 1, an $n^+$-type buffer layer 16 and a first $n^-$-type silicon carbide epitaxial layer (first semiconductor layer of the first conductivity type) 2 are deposited.

The $n^+$-type starting substrate 1 is, for example, a silicon carbide single crystalline substrate doped with nitrogen (N). The $n^+$-type buffer layer 16 is, for example, is a layer having a thickness in a range of 1 μm to 5 μm and is doped with nitrogen to have a high concentration in range of $1 \times 10^{17}/$ $cm^3$ to $1 \times 10^{18}/cm^3$. The $n^+$-type buffer layer 16 encourages the recombination of holes from the first $n^-$-type silicon carbide epitaxial layer 2, controls the concentration of holes that reach the $n^+$-type starting substrate 1, and suppresses the occurrence of stacking defects and increases in the surface area thereof.

The first $n^-$-type silicon carbide epitaxial layer 2 is a low-concentration $n^-$-type drift layer doped with, for example, nitrogen and has an impurity concentration that is lower than an impurity concentration of the $n^+$-type starting substrate 1. At a first surface of the first $n^-$-type silicon carbide epitaxial layer 2, opposite a second surface thereof facing the $n^+$-type starting substrate 1, a second $n^-$-type silicon carbide layer 6 is formed. The second $n^-$-type silicon carbide layer 6 is a high-concentration n$^-$-type drift layer doped with, for example, nitrogen and has an impurity concentration that is lower than the impurity concentration of the n$^+$-type starting substrate and higher than the impurity concentration of the first n$^-$-type silicon carbide epitaxial layer 2. Hereinafter, the n$^+$-type starting substrate 1, the first n$^-$-type silicon carbide epitaxial layer 2, the second n$^-$-type silicon carbide layer 6, and a later-described p-type base layer 3 combined are assumed to be a silicon carbide semiconductor base.

At a second surface (back surface, i.e., back surface of the silicon carbide semiconductor base) of the n$^+$-type starting substrate 1, a drain electrode (not depicted) is provided. At a surface of the drain electrode, a drain electrode pad 14 is provided.

In the silicon carbide semiconductor base, at the first surface (surface of the p-type base layer 3) thereof, a trench gate structure is formed. In particular, trenches 18 penetrate through n$^+$-type source regions (first semiconductor regions) 7 and the p-type base layer 3 from a front side of the n$^+$-type starting substrate 1 and reach the second n$^-$-type silicon carbide layer 6. Along inner walls of the trenches 18, gate insulating films 9 are formed on bottoms and sidewalls of the trenches 18 and gate electrodes 10 are formed on the gate insulating films 9 in the trenches 18, respectively. The gate electrodes 10 are insulated from the first n$^-$-type silicon carbide epitaxial layer 2, the second n$^-$-type silicon carbide layer 6, and the p-type base layer 3 by the gate insulating films 9. A portion of each of the gate electrodes 10 may protrude toward a source electrode pad 15, from an upper portion (side facing the source electrode pad 15) of each of the trenches 18.

In the first n$^-$-type silicon carbide epitaxial layer 2 and the second n$^-$-type silicon carbide layer 6, first p$^+$-type regions 4 and second p$^+$-type regions 5 are selectively provided. The first p$^+$-type regions 4 reach deep positions that are closer to a drain than are the bottoms of the trenches 18. A lower end (end facing the drain) of each of the first p$^+$-type regions 4 is positioned closer to the drain than are the bottoms of the trenches 18. Each of the first p$^+$-type regions 4 is provided between a corresponding adjacent two of the trenches 18. In FIG. 1, while the first p$^+$-type regions 4 are depicted as being in contact with later described p$^{++}$-type contact regions 8, configuration may be such that the first p$^+$-type regions 4 are apart from the p$^{++}$-type contact regions 8. In this instance, the first p$^+$-type regions 4 are also provided in the second n$^-$-type silicon carbide layer 6, at the surface thereof, and upper surfaces of the first p$^+$-type regions 4 are in contact with the p-type base layer 3.

A lower end of each of the second p$^+$-type regions 5 is positioned closer to the drain than are the bottoms of the trenches 18. The second p$^+$-type regions 5 are formed at positions facing the bottoms of the trenches 18 in a depth direction z, respectively. A width of each of the second p$^+$-type regions 5 is wider than a width of each of the trenches 18. The bottoms of the trenches 18 may reach the second p$^+$-type regions 5, respectively, or may be positioned in the second n$^-$-type silicon carbide layer 6, between the p-type base layer 3 and the second p$^+$-type regions 5, apart from the second p$^+$-type regions 5. The first p$^+$-type regions 4 and the second p$^+$-type regions 5 are doped with, for example, aluminum (Al).

Configuration is such that portions of each of the first p$^+$-type regions 4 extend toward the trenches 18 and are connected to the second p$^+$-type regions 5. In this case, in a plan view, the portions of the first p$^+$-type regions 4 may have a layout in which the portions of the first p$^+$-type regions 4 are disposed repeatedly alternating with the second n$^-$-type silicon carbide layer 6 in a direction (hereinafter, second direction) y orthogonal to a direction (hereinafter, first direction) x in which the first p$^+$-type regions 4 and the second p$^+$-type regions 5 are arranged. In other words, in the orthogonal second direction y, the portions of the first p$^+$-type regions 4 and portions of the second p$^+$-type regions 5 are connected to each other at least at one location. As a result, holes occurring during avalanche breakdown at a connection portion between the second p$^+$-type regions 5 and the first n$^-$-type silicon carbide epitaxial layer 2 may be efficiently migrated to ohmic electrodes 13 and the load applied to the gate insulating films 9 may be reduced, thereby enhancing reliability.

At the first surface of the first n$^-$-type silicon carbide epitaxial layer 2, the p-type base layer (second semiconductor layer of a second conductivity type) 3 is provided. An impurity concentration of the p-type base layer 3 may be, for example, lower than an impurity concentration of the first p$^+$-type regions 4. As a result, even when the concentration of the p-type base layer 3 is lowered to reduce the threshold voltage, spreading of the depletion layer of the p-type base layer 3 is suppressed, whereby decreases in the breakdown voltage due to punch-through may be avoided. In the p-type base layer 3, at a first surface thereof, opposite to a second surface thereof facing the n$^+$-type starting substrate 1, the n$^+$-type source regions 7 and the p$^{++}$-type contact regions 8 are selectively provided. Further, the n$^+$-type source regions 7 and the p$^{++}$-type contact regions 8 are in contact with one another.

In FIG. 1, while only two trench MOS structures are depicted, numerous MOS gate (insulated gate formed by a metal, oxide film, and semiconductor) structures having a trench structure may be further disposed in parallel.

An interlayer insulating film 11 is provided in an entire area of the first surface of the silicon carbide semiconductor base so as to cover the gate electrodes 10 embedded in the trenches 18. The ohmic electrodes (source electrodes) 13 contain a nickel silicide (NiSi) and are in contact with the n$^+$-type source regions 7 and the p$^{++}$-type contact regions 8 via openings in the interlayer insulating film 11. The ohmic electrodes 13 are electrically insulated from the gate electrodes 10 by the interlayer insulating film 11. On the ohmic electrodes 13, the source electrode pad (surface electrode) 15 is provided.

Further, between the source electrode pad 15 and the ohmic electrodes 13 and the interlayer insulating film 11, for example, a barrier metal 20 that prevents diffusion of metal atoms from the ohmic electrodes 13 to the gate electrodes 10 is provided.

Figure 2:
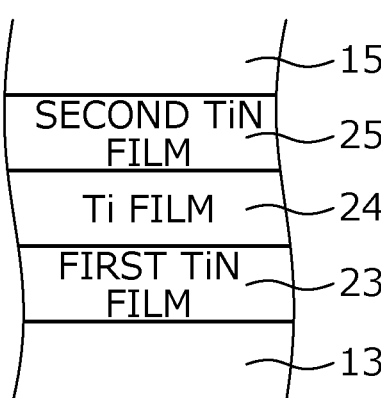
FIG. 2 is a cross-sectional view depicting a structure of a barrier metal on an ohmic electrode of the silicon carbide semiconductor device according to the embodiment.
Figure 3:
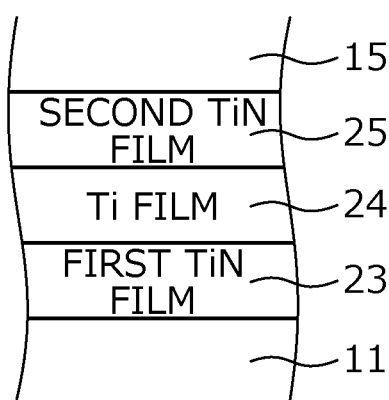
FIG. 3 is a cross-sectional view depicting a structure of the barrier metal on an interlayer insulating film of the silicon carbide semiconductor device according to the embodiment.

FIG. 2 is a cross-sectional view depicting a structure of the barrier metal on the ohmic electrode of the silicon carbide semiconductor device according to the embodiment. FIG. 3 is a cross-sectional view depicting the structure of the barrier metal on the interlayer insulating film of the silicon carbide semiconductor device according to the embodiment. FIG. 2 is an enlarged view of a cross-section of a region S1 depicted in FIG. 1 and FIG. 3 is an enlarged view of a cross-section of a region S2 depicted in FIG. 1. As depicted in FIGS. 2 and 3, the barrier metal 20 is provided similarly on the silicon carbide semiconductor base. Thus, the barrier metal 20 has a same configuration on the ohmic electrodes 13 and on the interlayer insulating film 11 and is formed by a first TiN film 23, a Ti film 24, and a second TiN film 25. On the second TiN film 25, the source electrode pad 15 containing Al or Al—Si is provided.

Figures 4, 5:
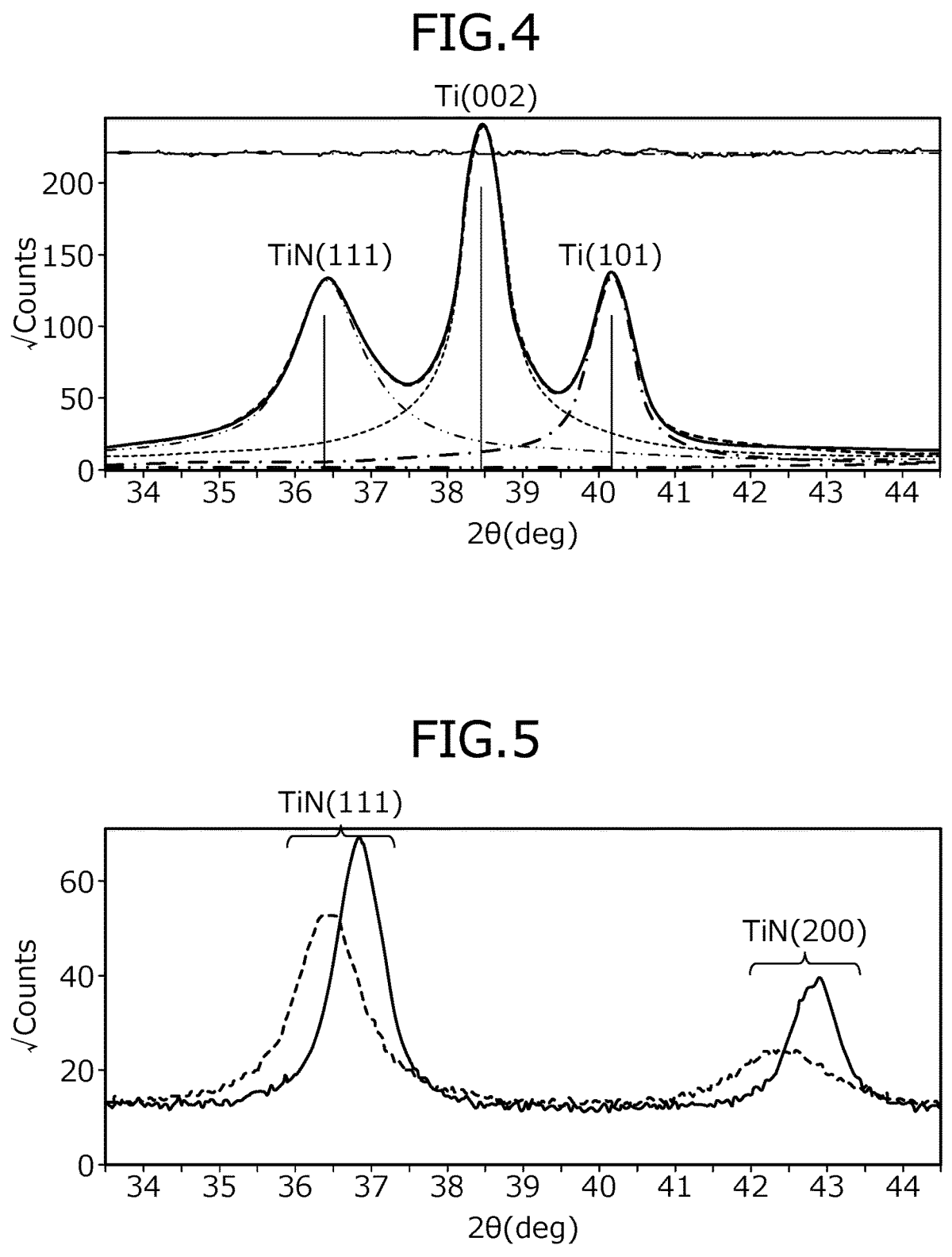

Here, FIGS. 4 and 5 depict results of measurement of the crystalline structures of Ti and TiN by X-ray diffraction. In FIGS. 4 and 5, a horizontal axis indicates X-ray irradiation angle 2θ in units of degrees (deg). A vertical axis indicates count. FIG. 4 is a graph depicting the crystalline structure of Ti and TiN in an instance in which the TiN film is formed on the Ti film. In this instance, as depicted in FIG. 4, orientation is affected by Ti and thus, the TiN film has TiN (111) orientation and does not have TiN (200) orientation. Meanwhile, FIG. 5 is a graph depicting the crystalline structure of TiN in an instance in which the TiN film is formed directly on a $SiO_2$ film. In FIG. 5, a dotted line is an instance in which annealing treatment is not performed and a solid line is an instance in which annealing treatment is performed. As depicted in FIG. 5, in the instance in which the TiN film is formed directly on the $SiO_2$ film, irrespective of whether annealing treatment is performed, TiN (111) and TiN (200) orientations are present.

Figures 6, 7:
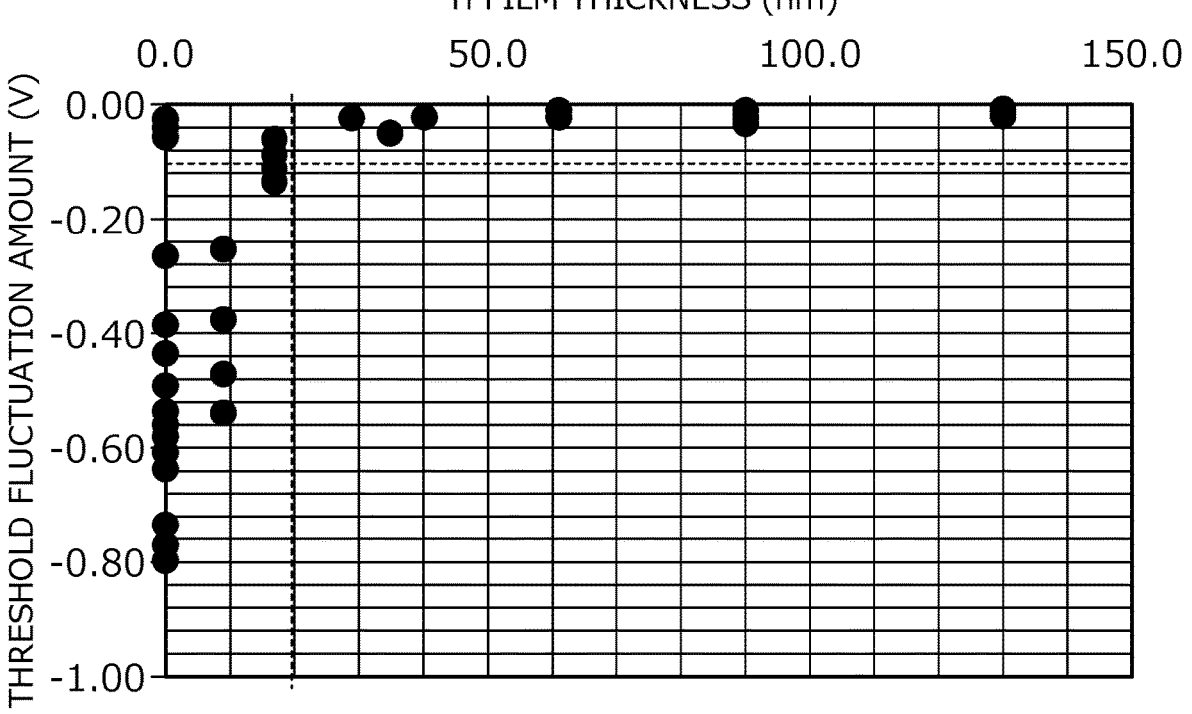
FIG. 6 is a table indicating for each film of the barrier metal, whether the film has TiN (200) and a grain size of the TiN (200).
FIG. 7 is a graph depicting a relationship between thickness of the Ti film of the barrier metal and threshold fluctuation of the silicon carbide semiconductor device according to the embodiment.

FIG. 6 is a table indicating for each film of the barrier metal, whether the film has TiN (200) and the grain size of the TiN (200). The Ti film of the barrier metal contains pure Ti and does not have TiN (200) orientation. From the results depicted in FIG. 5, the TiN film formed directly on the $SiO_2$ film and the TiN film that is formed directly on the $SiO_2$ film and annealed both have TiN (200) orientation. Due to the annealing, the average grain size (crystal grain size) of TiN (200) increases and thus, the average grain size of TiN (200) of the annealed TiN film is greater than the average grain size of TiN (200) of the non-annealed TiN film. Instead of annealing, the average grain size of TiN (200) of the TiN film may be increased by increasing the formation temperature of the TiN film. Further, from the results depicted in FIG. 4, in the instance in which the TiN film is formed on the Ti film, TiN (200) orientation is not present.

From the results depicted in FIGS. 4 to 6, layers of the barrier metal 20 of the embodiment are as follows. The first TiN film 23 is provided on the ohmic electrodes 13 and on the interlayer insulating film 11; orientation is affected by Ti and thus, the first TiN film 23 has TiN (200) orientation. Further, as described hereinafter, the annealing treatment is performed after the formation of the first TiN film 23 and therefore, the average grain size of TiN increases. The second TiN film 25 is provided on the Ti film 24 and takes over the Ti crystal orientation and thus, the second TiN film 25 has TiN (111) orientation and does not have TiN (200) orientation. Further, as described hereinafter, the annealing treatment is not performed after the formation of the second TiN film 25 and thus, the average grain size of TiN is smaller than the average grain size of TiN of the first TiN film 23. For example, in the X-ray diffraction, the average grain size of TiN of the first TiN film 23 obtained from the half width of TiN (111), which is a main orientation, is 15 nm or larger while the average grain size of TiN of the second TiN film 25 greater than 11 nm. The Ti film 24 is sandwiched between the first TiN film 23 and the second TiN film 25 and thus, is pure Ti.

FIG. 7 is a graph depicting a relationship between thickness of the Ti film of the barrier metal and threshold fluctuation of the silicon carbide semiconductor device according to the embodiment. In FIG. 7, a horizontal axis indicates thickness of the Ti film 24 of the barrier metal 20 in units of nm. A vertical axis indicates threshold fluctuation in units of V. As depicted in FIG. 7, the threshold fluctuation is set to be −0.1V or less and thus, the thickness of the Ti film 24 may be preferably set to 20 nm or greater. Further, when the thickness of the Ti film 24 exceeds 100 nm, coverage becomes poor and thus, the thickness of the Ti film 24 may be preferably set to be not more than 100 nm.

Figure 8:
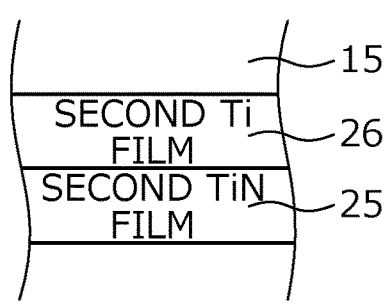
FIG. 8 is a cross-sectional view depicting another structure of the barrier metal of the silicon carbide semiconductor device according to the embodiment.

FIG. 8 is a cross-sectional view depicting another structure of the barrier metal of the silicon carbide semiconductor device according to the embodiment. As depicted in FIG. 8, a second Ti film 26 may be provided on the second TiN film 25. The barrier effect of the barrier metal 20 may be further enhanced by the second Ti film 26. Further, while not depicted, a metal such as Ti, tantalum (Ta), tungsten (W), molybdenum (Mo), etc. may be provided between the first TiN film 23 and, the ohmic electrodes 13 and the interlayer insulating film 11.

As described, the barrier metal 20 of the silicon carbide semiconductor device according to the embodiment has the same structure on the ohmic electrodes 13 and on the interlayer insulating film 11, and is formed by the first TiN film 23, the Ti film 24, and the second TiN film 25. The Ti film 24 intervenes between the first TiN film 23 and the second TiN film 25 and the Ti film 24 contains pure Ti. Thus, hydrogen contained in the source electrode pad 15 and the upper layer portion thereof may be prevented from reaching the gate interface due to the hydrogen storage capability of the pure Ti between the gate interface and the source electrode pad 15 and threshold fluctuation may be suppressed.

Figure 9:
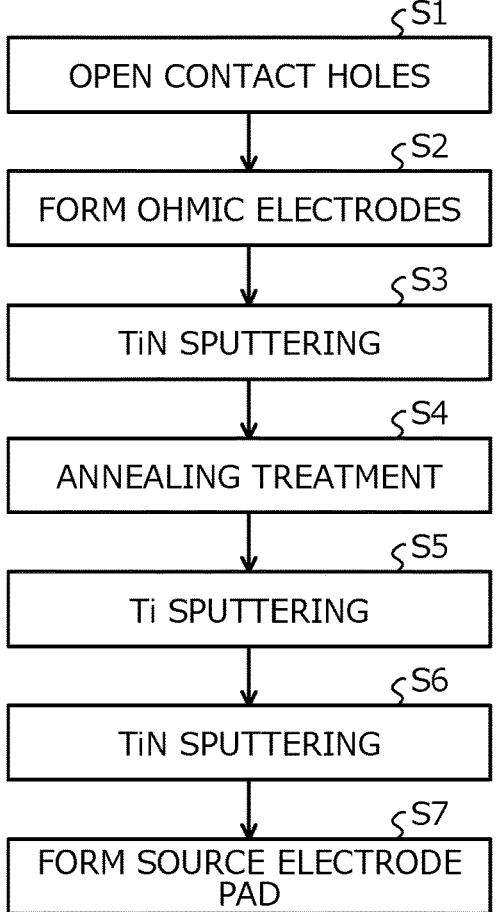
FIG. 9 is a flowchart showing an outline of formation of the barrier metal of the silicon carbide semiconductor device according to the embodiment.
Figure 10:
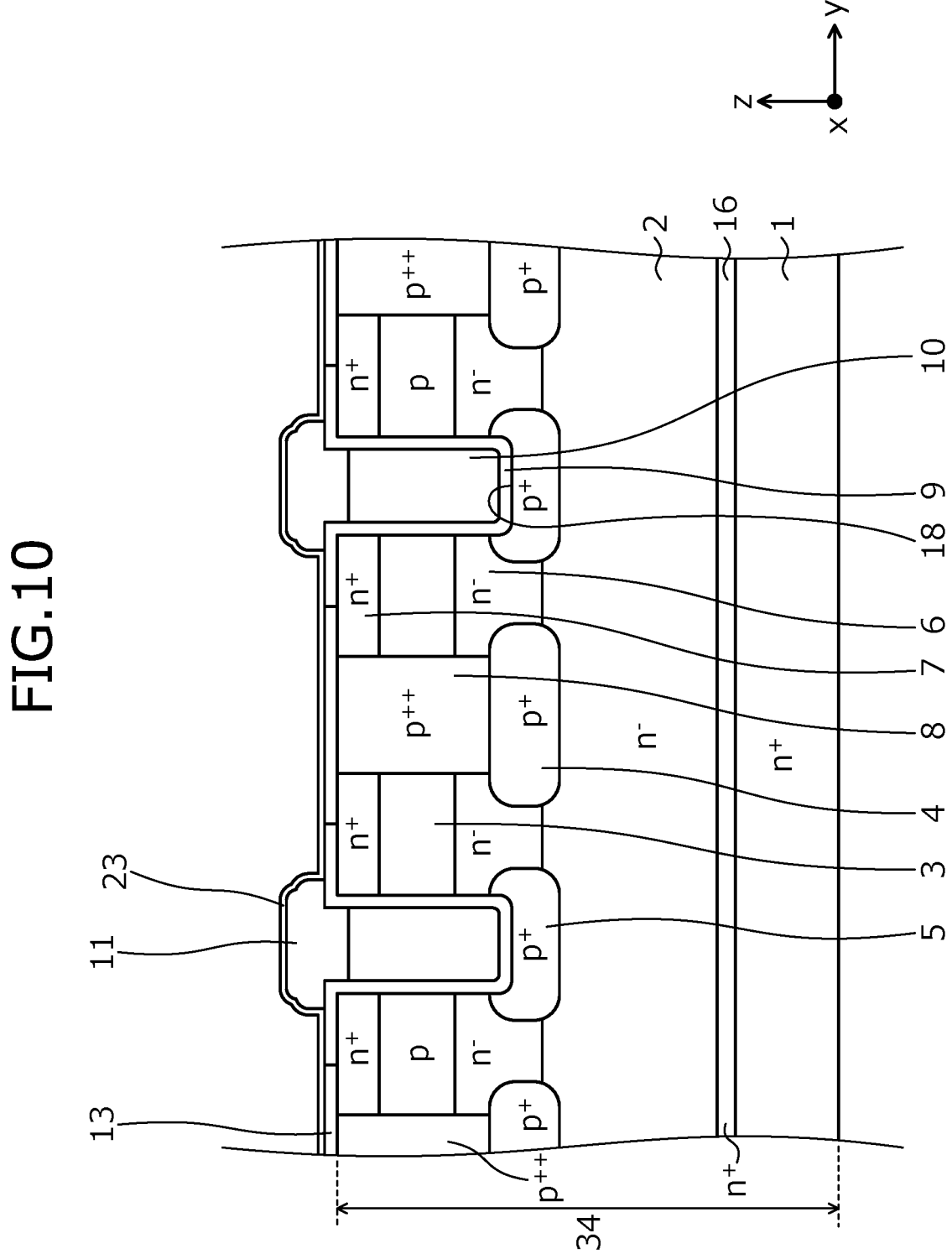
FIG. 10 is a cross-sectional view schematically depicting a state of the barrier metal of the silicon carbide semiconductor device according to the embodiment during manufacture.
Figure 11:
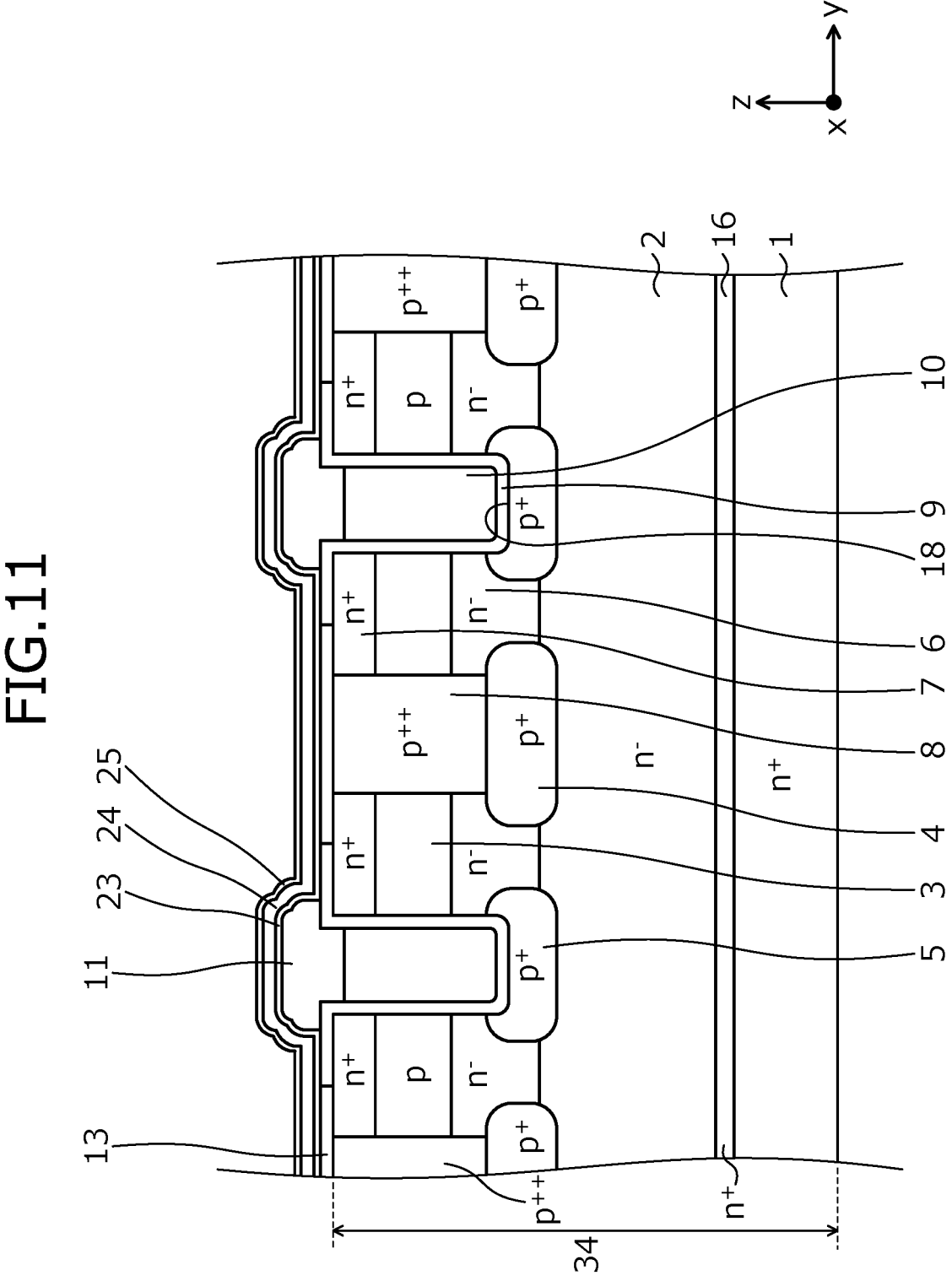
FIG. 11 is a cross-sectional view schematically depicting a state of the barrier metal of the silicon carbide semiconductor device according to the embodiment during manufacture.
Figure 12:
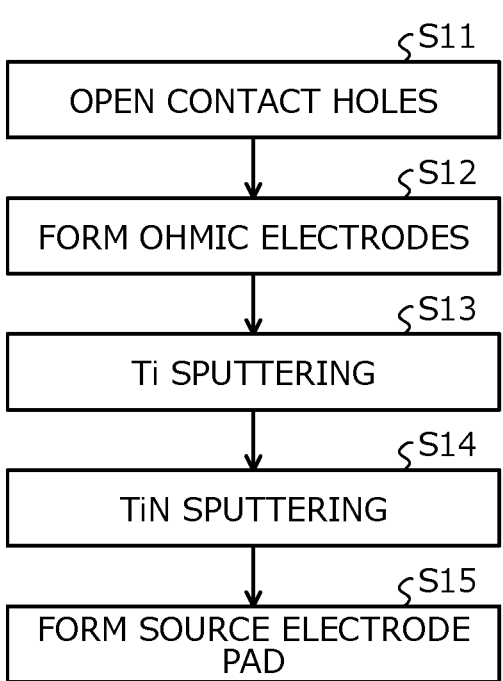
FIG. 12 is a flowchart showing an outline of barrier metal formation of a conventional silicon carbide semiconductor device.

Next, a method of manufacturing a silicon carbide semiconductor device according to the embodiment is described. FIG. 9 is a flowchart showing an outline of formation of the barrier metal of the silicon carbide semiconductor device according to the embodiment. FIGS. 10 and 11 are cross-sectional views schematically depicting states of the barrier metal of the silicon carbide semiconductor device according to the embodiment during manufacture.

First, a silicon carbide semiconductor substrate 34 (refer to FIG. 1) in which the first $n^-$-type silicon carbide epitaxial layer 2 and the $n^+$-type buffer layer 16 are deposited on the $n^+$-type starting substrate 1 containing an n-type silicon carbide is prepared (first process). The silicon carbide semiconductor substrate 34 may be purchased or the $n^+$-type starting substrate 1 alone may be purchased and the $n^+$-type buffer layer 16 and the first $n^-$-type silicon carbide epitaxial layer 2 may be formed by epitaxial growth thereby forming the silicon carbide semiconductor substrate 34 described above. In this instance, the $n^+$-type buffer layer 16 containing silicon carbide and doped with an n-type impurity, for example, nitrogen atoms (N) is epitaxially grown on the first surface of the $n^+$-type starting substrate 1. Next, the first $n^-$-type silicon carbide epitaxial layer 2 containing silicon carbide and doped with an n-type impurity, for example, nitrogen atoms is grown on the $n^+$-type buffer layer 16.

Next, impurity ions are selectively implanted at the surface of the silicon carbide semiconductor substrate 34. As a result, impurity regions (for example, the p-type base layer 3, the first $p^+$-type regions 4, the second $p^+$-type regions 5, the second $n^-$-type silicon carbide layer 6, the $n^+$-type source regions 7, the $p^{++}$-type contact regions 8, etc.) are formed in the silicon carbide semiconductor substrate 34. These impurity regions are formed as follows.

First, on the surface of the first $n^-$-type silicon carbide epitaxial layer 2, a non-depicted resist mask having predetermined openings is formed by a photolithographic technique. Subsequently, a p-type impurity, for example, aluminum atoms, is ion-implanted, thereby forming in the first $n^-$-type silicon carbide epitaxial layer 2, the first $p^+$-type regions 4 and the second $p^+$-type regions 5 having a thickness of about 0.6 μm and an impurity concentration in a range of, for example, 1 to $5 \times 10^{18}/cm^3$.

Next, on the surface of the first n⁻-type silicon carbide epitaxial layer 2, a non-depicted resist mask having predetermined openings is formed by a photolithographic technique. Subsequently, the second n⁻-type silicon carbide layer 6 doped with an n-type impurity such as nitrogen and having a thickness of about 0.7 μm and an impurity concentration in a range of, for example, 1 to $3\times10^{17}$/cm³ is formed. The second n⁻-type silicon carbide layer 6 may be formed on the surface of the first n⁻-type silicon carbide epitaxial layer 2 by epitaxial growth.

Next, on the surface of the first n⁻-type silicon carbide epitaxial layer 2, a non-depicted resist mask having predetermined openings is formed by a photolithographic technique. Subsequently, the p-type base layer 3 having a thickness of about 0.5 μm and an impurity concentration in a range of, for example, 1 to $5\times10^{17}$/cm³ is formed (second process). The p-type base layer 3 may be formed on the surface of the second n⁻-type silicon carbide layer 6 by epitaxial growth.

Next, on the surface of the p-type base layer 3, a non-depicted resist mask having predetermined openings is formed by a photolithographic technique. Subsequently, the n⁺-type source regions 7 having a thickness of about 0.5 μm and an impurity concentration, for example, in a range of 1 to $3\times10^{19}$/cm³ are formed by ion implantation (third process).

Next, an ion implantation mask having predetermined openings is formed and a p-type impurity such as aluminum is ion-implanted in portions of the n⁺-type source regions 7 and in portions of the p-type base layer 3, thereby, forming the p⁺⁺-type contact regions 8 having an impurity concentration, for example, in a range of 1 to $3\times10^{20}$/cm³.

Next, a heat treatment is performed under an inert gas atmosphere of about 1750 degrees C., thereby, implementing an activation treatment for impurity regions formed by ion implantation. The ion-implanted regions may be collectively activated by a single session of the heat treatment or may be activated by performing the heat treatment each time ion implantation is performed.

Next, on the surface of the n⁺-type source regions 7, a trench formation mask having predetermined openings is formed by photolithography using, for example, an oxide film. The trenches 18, which penetrate through the n⁺-type source regions 7 and the p-type base layer 3 and reach the second p⁺-type regions 5 are formed by dry etching (fourth process). Next, the trench formation mask is removed.

After the trenches 18 are formed, isotropic etching for removing damage of the trenches 18 and/or sacrificial oxidation for rounding corners of openings of the trenches 18 and the bottoms of the trenches 18 may be performed. Either the isotropic etching or the sacrificial oxidation may be performed. Alternatively, the isotropic etching may be performed and thereafter, the sacrificial oxidation may be performed. As a result, a clean surface of the silicon carbide may be obtained and by rounding the corners, electric field concentration at the openings and the bottoms of the trenches 18 may be suppressed.

Next, along the surfaces of the n⁺-type source regions 7 and the p⁺⁺-type contact regions 8 and along the bottoms and sidewalls of the trenches 18, the gate insulating films 9 are formed. The gate insulating films 9 may be formed by thermal oxidation of a temperature of about 1300 degrees C. under a gas atmosphere containing oxygen. Further, the gate insulating films 9 may be formed by a deposition method by a chemical reaction such as that for a high temperature oxide (HTO).

Next, a polycrystalline silicon layer doped with, for example, phosphorus atoms is provided on the gate insulating films 9. The polycrystalline silicon layer may be formed so as to be embedded in the trenches 18. The polycrystalline silicon layer is patterned by photolithography and is left in the trenches 18, thereby, forming the gate electrodes 10 (fifth process).

Next, an insulating film is formed at the surface of the gate electrodes 10. For example, annealing under an oxygen atmosphere of 1000 degrees C. is performed and a thermal oxide film is formed. Next, the surface is protected by a protective film formed with, for example, a photoresist. Next, the insulating film, the gate electrodes, and the gate insulating films formed at the back surface are all removed by dry etching. Next, the protective film formed at the surface in an ash peeling process is removed.

Next, for example, a phosphate glass is deposited so as to cover the gate insulating films 9 and the gate electrodes 10 and have a thickness of about 1 μm, thereby, forming the interlayer insulating film 11. Next, the interlayer insulating film 11 and the gate insulating films 9 are patterned by photolithography and contact holes that expose the n⁺-type source regions 7 and the p⁺⁺-type contact regions 8 are formed (step S1). Next, in the described contact holes and on the interlayer insulating film 11, a conductive film constituting the ohmic electrodes 13 is formed by, for example, nickel by, for example, sputtering (step S2: seventh process). Next, a heat treatment of about 1000 degrees C. is performed selectively causing the conductive film and the silicon carbide to react with each other and thereafter, unreacted portions of the conductive film are selectively removed, leaving the ohmic electrodes 13 only in the contact holes, the ohmic electrodes 13 being in contact with the n⁺-type source regions 7 and the p⁺⁺-type contact regions 8.

Next, the first TiN film 23 is formed uniformly at the surfaces of the ohmic electrodes 13 and the interlayer insulating film 11 by sputtering (step S3: eighth process). At step S3, the substrate temperature during the film formation is set to be a high temperature in a range of 200 degrees C. to 400 degrees C., whereby the density of the first TiN film 23 may be enhanced. In this instance, an annealing treatment at later-described step S4 may be omitted. At step S3, instead of increasing the substrate temperature, the density of the first TiN film 23 may be improved by performing annealing (heat treatment) on the first TiN film 23. Here, the average grain size is known to increase (step S4: ninth process). A temperature of the annealing may be preferably in a range of 400 degrees C. to 800 degrees C. The effect of improving the density is not expected below 400 degrees C. as the temperature is equal to or less than that at the time of film formation. When the temperature is above 800 degrees C., unevenness of the surface of the TiN becomes too great. The state up to here is depicted in FIG. 10. As described, the average grain size of the first TiN film 23 is increased, whereby the nickel contained in the ohmic electrodes 13 may be efficiently prevented from moving toward the source electrode pad 15. Here, after step S3 or S4, exposure to an oxygen atmosphere such as ambient air oxygen may be performed to cause oxygen absorption at the grain boundary. As a result, the movement of nickel may be prevented more efficiently.

Next, the Ti film 24 is formed at the surface of the first TiN film 23 by a sputtering method (step S5: tenth process). Next, the second TiN film 25 is formed at the surface of the Ti film 24 by a sputtering method (step S6: eleventh process). As a result, the barrier metal 20 configured by the first TiN film 23, the Ti film 24, and the second TiN film 25 is formed. The state up to here is depicted in FIG. 11. Subsequently, the second Ti film 26 may be formed at the surface of the second TiN film 25 by a sputtering method. At steps S5 and S6, the substrate temperature during the film formation is set to be not more than 200 degrees C., whereby the average grain size of TiN of the second TiN film 25 is reduced. As described, the average grain size of TiN of the second TiN film 25 is set to be small, whereby entry of hydrogen ions from the source electrode pad 15 may be efficiently prevented.

Next, for example, an Al metal film constituting the source electrode pad 15 is formed on the barrier metal 20, for example, a sputtering method. The metal film, for example, may be formed using aluminum containing silicon at a rate of 1% (Al—Si). Next, the metal film is selectively removed, thereby, forming the source electrode pad 15 (step S7: twelfth process). Further, after the formation of the source electrode pad 15, the Ti film 24 of the barrier metal 20 configured by the first TiN film 23, the Ti film 24, and the second TiN film 25 is not nitrided and thus, annealing treatment at a temperature of 450 degrees C. or higher is not performed.

Next, the front surface of the n⁺-type starting substrate 1 may be covered and protected by a protective film (not depicted) and thereafter, the n⁺-type starting substrate 1 may be ground from the back surface thereof to thin the n⁺-type starting substrate 1 to a product thickness.

Next, on the second surface of the n⁺-type starting substrate 1, conductive films constituting the drain electrode (not depicted), for example, molybdenum film and a nickel film, for example, are successively formed by a sputtering method. Thereafter, for example, a heat treatment such as laser annealing is performed and the n⁺-type starting substrate 1 and the conductive film are caused to react with each other, forming an ohmic contact, whereby the drain electrode is formed.

Next, for example, as the drain electrode pad 14, titanium, nickel, and gold are deposited in the order state, on the surface of the drain electrode (thirteenth process). As described, silicon carbide semiconductor device depicted in FIG. 1 is completed.

As described above, according to the embodiment, the barrier metal has the same structure on the ohmic electrode and on the interlayer insulating film, the Ti film is sandwiched between the first TiN film and the second TiN film, and the Ti film contains pure Ti. As a result, hydrogen contained in the source electrode pad and the upper layer portion thereof may be prevented from reaching the gate interface due to the hydrogen storage capability of the pure Ti between the gate interface and the source electrode pad and threshold fluctuation may be suppressed.

In the foregoing, the present invention may be variously modified within a range not departing from the spirit of the invention and in the embodiments described above, for example, dimensions, impurity concentrations, etc. of parts may be variously set according to necessary specifications. In the embodiments, while a trench-type MOSFET is described as an example, application to a planar type MOSFET as well as to various types of semiconductor devices such as an insulated gate bipolar transistor (IGBT) is further possible. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the barrier metal has the same configuration on the ohmic electrode and on the interlayer insulating film, the Ti film is sandwiched between the first TiN film and the second TiN film, and the Ti film contains pure Ti. As a result, hydrogen contained in the source electrode pad and the upper layer portion thereof may be prevented from reaching the gate interface due to the hydrogen storage capability of the pure Ti between the gate interface and the source electrode pad and threshold fluctuation may be suppressed.

The silicon carbide semiconductor device and the method of manufacturing a silicon carbide semiconductor device according to the present invention achieve an effect in that the barrier effect of the barrier metal is enhanced and threshold fluctuation may be suppressed.

As described above, the silicon carbide semiconductor device and the method of manufacturing a silicon carbide semiconductor device according to the present invention are useful for power semiconductor devices used in power converting equipment such as inverters, power source devices of various types of industrial machines, igniters of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a starting substrate of a first conductivity type, having a first surface and a second surface that are opposite to each other;
   a first semiconductor layer of the first conductivity type, provided at the first surface of the starting substrate, the first semiconductor layer having an impurity concentration that is lower than an impurity concentration of the starting substrate, the first semiconductor layer having a first surface and a second surface that are opposite to each other, the second surface of the first semiconductor layer facing the first surface of the starting substrate;
   a second semiconductor layer of a second conductivity type, provided at the first surface of the first semiconductor layer, the second semiconductor layer having a first surface and a second surface that are opposite to each other, the second surface of the second semiconductor layer facing the first surface of the first semiconductor layer;
   a first semiconductor region of the first conductivity type, selectively provided in the second semiconductor layer, at the first surface of the second semiconductor layer;
   a gate electrode provided at a surface of the first semiconductor region and the first surface of the second semiconductor layer via a gate insulating film;
   an interlayer insulating film covering the gate insulating film and the gate electrode;
   an ohmic electrode provided at the surface of the first semiconductor region and the first surface of the second semiconductor layer;
   a barrier metal provided at a surface of the ohmic electrode and a surface of the interlayer insulating film;
   a surface electrode provided at a surface of the barrier metal; and
   a back electrode provided at the second surface of the starting substrate, wherein the barrier metal has a three-layered structure including a first TiN film, a Ti film, and a second TiN film, and the first TiN film contains TiN having a crystal grain, a size of which is larger than a size of a crystal grain contained in TiN of the second TiN film.

2. The silicon carbide semiconductor device according to claim 1, wherein the first TiN film has a TiN (200) orientation, and the second TiN film is free of the TiN (200) orientation.

3. The silicon carbide semiconductor device according to claim 1, wherein the Ti film has a thickness that is in a range of 20 nm to 100 nm.

4. The silicon carbide semiconductor device according to claim 1, wherein the ohmic electrode contains a NiSi, and the first TiN film is in contact with the NiSi.

5. The silicon carbide semiconductor device according to claim 1, further comprising a second Ti film provided between the second TiN film and the surface electrode.

6. The silicon carbide semiconductor device according to claim 1, further comprising a trench that penetrates through the first semiconductor region and the second semiconductor layer and reaches the first semiconductor layer, wherein the gate insulating film and the gate electrode are provided in the trench.

7. A method of manufacturing a silicon carbide semiconductor device, the method comprising:

preparing a starting substrate of a first conductivity type, the starting substrate having a first surface and a second surface opposite to each other;

forming a first semiconductor layer of the first conductivity type at the first surface of the starting substrate, the first semiconductor layer having an impurity concentration that is lower than an impurity concentration of the starting substrate, the first semiconductor layer having a first surface and a second surface opposite to each other, the second surface of the first semiconductor layer facing the starting substrate;

forming a second semiconductor layer of a second conductivity type at the first surface of the first semiconductor layer, the second semiconductor layer having a first surface and a second surface opposite to each other, the second surface of the second semiconductor layer facing the first semiconductor layer;

selectively forming a first semiconductor region of the first conductivity type in the second semiconductor layer, at the first surface of the second semiconductor layer;

forming a gate electrode at a surface of the first semiconductor region and a surface of the second semiconductor layer via a gate insulating film;

forming an interlayer insulating film covering the gate insulating film and the gate electrode;

forming an ohmic electrode at the surface of the first semiconductor region and the surface of the second semiconductor layer;

forming a first TiN film uniformly over a surface of the ohmic electrode and a surface of the interlayer insulating film;

forming a Ti film on the first TiN film;

forming a second TiN film on the Ti film, thereby forming a barrier metal having a three-layered structure including the first TiN film, the Ti film, and the second TiN film;

forming a surface electrode at a surface of the barrier metal; and forming a back electrode at the second surface of the starting substrate, wherein the first TiN film contains TiN having a crystal grain, a size of which is larger than a size of a crystal grain contained in TiN of the second TiN film.

8. The method according to claim 7, wherein the forming the first TiN film is performed at a temperature higher than a temperature at which the second TiN film is formed.

9. The method according to claim 7, further comprising performing a heat treatment on the first TiN film after forming the first TiN film but before forming the Ti film on the first TiN film.

10. The method according to claim 9, wherein the heat treatment is performed at a temperature in a range of 400 degrees C. to 800 degrees C.

11. The method according to claim 7, wherein after the forming the surface electrode at the surface of the barrier metal, the method excludes any heat treatment at 450 degrees C. or higher.

12. The method according to claim 7, further comprising forming a trench that penetrates through the first semiconductor region and the second semiconductor layer and reaches the first semiconductor layer, wherein the forming a gate electrode includes forming the gate insulating film and the gate electrode in the trench.

* * * * *